United States Patent
Shingu et al.

(10) Patent No.: US 8,053,289 B2
(45) Date of Patent: Nov. 8, 2011

(54) MANUFACTURING METHOD FOR THIN FILM TRANSISTOR ON INSULATOR

(75) Inventors: Takashi Shingu, Kanagawa (JP); Daisuke Ohgarane, Kanagawa (JP); Yurika Sato, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 325 days.

(21) Appl. No.: 12/251,596

(22) Filed: Oct. 15, 2008

(65) Prior Publication Data

US 2009/0096024 A1  Apr. 16, 2009

(30) Foreign Application Priority Data

Oct. 16, 2007  (JP) .................................. 2007-269036

(51) Int. Cl.
*H01L 21/786* (2006.01)
(52) U.S. Cl. ................................ 438/149; 257/E21.415
(58) Field of Classification Search .................. 438/149, 438/151; 257/E21.19, E21.415, E21.416
See application file for complete search history.

(56) References Cited

U.S. PATENT DOCUMENTS

| | | | | |
|---|---|---|---|---|
| 5,362,677 A | * | 11/1994 | Sakamoto et al. | ............ 438/167 |
| 5,571,735 A | | 11/1996 | Mogami et al. | |
| 5,646,435 A | * | 7/1997 | Hsu et al. | ....................... 257/382 |
| 5,918,130 A | * | 6/1999 | Hause et al. | .................... 438/290 |
| 6,140,167 A | * | 10/2000 | Gardner et al. | ................ 438/197 |
| 6,939,751 B2 | * | 9/2005 | Zhu et al. | ....................... 438/151 |
| 7,247,910 B2 | | 7/2007 | Lee et al. | |
| 7,259,045 B2 | | 8/2007 | Dejima | |
| 2007/0257262 A1 | | 11/2007 | Dejima | |
| 2008/0017924 A1 | * | 1/2008 | Matsumoto et al. | ........... 257/347 |

FOREIGN PATENT DOCUMENTS

| | | |
|---|---|---|
| JP | 08-070053 | 3/1996 |
| JP | 2003-243415 | 8/2003 |
| JP | 2003-526198 | 9/2003 |
| JP | 2004-281687 | 10/2004 |
| JP | 3658664 | 6/2005 |
| JP | 2006-074071 | 3/2006 |
| WO | WO 00/36634 | 6/2000 |
| WO | WO 03/069678 A1 | 8/2003 |

* cited by examiner

*Primary Examiner* — Jerome Jackson, Jr.
*Assistant Examiner* — Paul Budd
(74) *Attorney, Agent, or Firm* — Nixon Peabody LLP; Jeffrey L. Costellia

(57) ABSTRACT

In a method for manufacturing a semiconductor device, a semiconductor film formed over an insulator is doped with an impurity element to a depth less than the thickness of the semiconductor film, thereby forming an impurity doped layer; a metal silicide layer is formed on the impurity doped layer; the metal silicide layer and the semiconductor film are etched to form a recessed portion; and a layer which is not doped with the impurity element and is located at the bottom of the recessed portion of the semiconductor film is thinned to make a channel formation region. Further, a gate electrode is formed in the recessed portion over the thinned non impurity doped layer, with an insulating film interposed therebetween.

15 Claims, 14 Drawing Sheets impurity ion impurity ion

MANUFACTURING METHOD FOR THIN FILM TRANSISTOR ON INSULATOR

BACKGROUND OF THE INVENTION

1. Field of the Invention

The present invention relates to a semiconductor device and a manufacturing method thereof; in particular, to a semiconductor device having metal silicide layers on a source region and a drain region, and a manufacturing method thereof.

2. Description of the Related Art

As higher integration and further miniaturization of a semiconductor device such as a thin film transistor (also referred to as a TFT) are achieved, lower contact resistance with a doped region (e.g., a source region or a drain region of a transistor) formed in a semiconductor film including silicon, and lower resistance of the doped region have been required. It is effective in lowering the resistance to form a metal silicide layer such as a titanium silicide layer, a cobalt silicide layer, or a nickel silicide layer on a surface of the semiconductor film. Reduction in the resistance of the doped region and in the contact resistance therewith leads to reduction in heat generation and power consumption of a transistor.

Such a metal silicide layer can be formed in the following manner: a metal film is formed over a transistor so as to be in contact with a doped region formed in a semiconductor film including silicon, and then heat treatment or the like is carried out to the metal film and the semiconductor film, so that the silicon is diffused into the metal film or the metal is diffused into the semiconductor film including silicon; thus, the metal and the silicon react with each other (see Reference 1; Japanese Translation of PCT International Application No. 2003-526198; Reference 2: Japanese Published Patent Application No. H8-70053; and Reference 3: Japanese Published Patent Application No. 2006-74071).

In such a transistor having a metal silicide layer, however, the metal silicide can undesirably enter a channel formation region to cause a malfunction of the transistor. In particular, when a semiconductor film is thin, it is difficult to control the thickness of the metal silicide layer. In forming a metal silicide layer, the thermal treatment temperature, the thermal treatment time, and the thickness of the metal film are controlled; however, since it is difficult to control the thermal treatment, a method can be given in which the entire metal film which has been formed with the thickness controlled reacts with silicon in the semiconductor film. In such a method, when the semiconductor film is thin, the metal film also needs to be thinned (e.g., to a thickness of less than 10 nm) accordingly; however, it is difficult to form a thin metal film having a thickness of less than 10 nm, with the thickness controlled in nanometers. As an example of a technique for preventing metal silicide from entering a channel formation region, Reference 1 proposes that by ion implantation of silicon into a part of source/drain regions, a crystalline state is changed to an amorphous state to form an amorphous silicon layer, and only the amorphous silicon layer selectively reacts with the metal to form silicide. However, such a change of the part of the source/drain region to amorphous silicon complicates a process and increases manufacturing cost.

Further, Reference 4 (Japanese Patent No. 3658664) discloses that a gate electrode is formed over a substrate; a semiconductor film formed of amorphous or polycrystalline silicon and a silicide film are formed thereover and then are patterned by etching; and source/drain regions are formed, so that a thin film transistor is manufactured. In the manufacturing method disclosed in Reference 4, specifically, an $n^+$-Si film is formed over a semiconductor film that is formed over a gate electrode with a silicon nitride film interposed therebetween; a thin oxide film is formed on a surface of the $n^+$-Si film; and a metal film is formed on the thin oxide film to form a metal silicide layer between the metal film and the $n^+$-Si film. By forming the thin oxide film on the surface of the $n^+$-Si film in such a manner, the thickness of the metal silicide layer formed between the $n^+$-Si film and the metal film can be minimized, which facilitates etching of the metal silicide layer In such a manufacturing method of a thin film transistor, however, the gate electrode needs to withstand a high temperature or the like in forming the semiconductor film because the source and drain regions (the semiconductor film) are formed over the gate electrode after forming the gate electrode; therefore, there are limitations on the material or thickness of the gate electrode. In particular, when a polycrystalline silicon film is formed as the semiconductor film, a method can be given in which an amorphous silicon film is annealed with laser to form polycrystalline silicon; however; in a bottom gate structure, it is difficult to carry out laser annealing because of limitations such as heat resistance or thermal conductivity of the gate electrode. Further, a bottom gate structure cannot be formed on an SOI (silicon on insulator) substrate in which a single crystalline silicon layer is formed on an insulator using an SOI technique such as the Smart Cut method. In the manufacturing method of a thin film transistor which is described in Reference 4, the silicon nitride film that functions as a channel etch stopper in patterning the metal silicide layer, the $n^+$-Si film, and the semiconductor film is formed in a pattern over a portion of the semiconductor film which functions as a channel formation region over the gate electrode.

In a thin film transistor, it is known that the subthreshold swing, which shows switching characteristics (subthreshold characteristics) of a transistor, can be improved by thinning a channel formation region. The subthreshold swing is a gate voltage which is necessary for increasing a current (subthreshold current) between a source electrode and a drain electrode by one order of magnitude. As the subthreshold swing becomes smaller, the inclination of a subthreshold current with respect to a gate voltage becomes greater; in other words, the switching characteristics become better. Using a TFT with a small subthreshold swing has advantages such as suppression of power consumption which is due to reduction in operation voltage and reduction in off leakage current. However, when an entire semiconductor film in which a channel formation region is formed is thinned in order to thin the channel formation region, a source region and a drain region are also thinned; thus, there arise problems of increase in sheet resistance in the source and drain regions and increase in contact resistance between the source and drain regions and source and drain electrodes. Therefore, it is preferable that the thickness of the channel formation region be reduced while an adequate thickness of the source and drain regions is secured.

Reference 5 (Japanese Published Patent Application No. 2004-281687) discloses an example of such a technique for thinning a channel formation region. According to Reference 5, a photosensitive resist formed over a semiconductor layer (operation layer) is exposed to light using a half-tone mask, thereby making the thickness of a part of the photosensitive resist over a channel formation region in a TFT formation region smaller than the thickness of a part of the photosensitive resist in a region other than the channel formation region. Then, the photosensitive resist is further processed to remove the part of the photosensitive resist over the channel formation region, and the remaining part of the photosensitive resist is used as a mask to thin the channel formation region by wet-etching or dry-etching. However, no mention is made of forming a metal silicide layer in Reference 5.

SUMMARY OF THE INVENTION

A first object of the present invention is to provide a thin film transistor (a semiconductor device) in which a metal silicide layer is formed on a surface of a doped region and entrance of the metal silicide into a channel formation region is surely prevented, and which generates less heat, consumes less power, and can be manufactured in a high yield; and a method for manufacturing the thin film transistor.

A second object of the present invention is to provide a thin film transistor (a semiconductor device) in which a metal silicide layer is formed on a surface of a doped region and entrance of the metal silicide into a channel formation region is surely prevented, and which generates less heat, consumes less power, can be manufactured in a high yield, and in which the thickness of a channel formation region is smaller than that of a source region and a drain region, and subthreshold swing is improved; and a method for manufacturing the thin film transistor.

To achieve the above objectives, according to the present invention, a method for manufacturing a semiconductor device is provided which includes the steps of forming a semiconductor film over an insulator, using a semiconductor material including silicon; doping the semiconductor film with an impurity element to a depth smaller than a thickness of the semiconductor film, thereby forming an impurity doped layer and leaving a non impurity doped layer that is not doped with the impurity element under the impurity doped layer; forming a metal silicide layer on an upper surface of the semiconductor film; patterning the metal silicide layer and the semiconductor film by etching, thereby forming a recessed portion that reaches the non impurity doped layer at a position corresponding to a channel formation region of the semiconductor device, and thinning a portion of the semiconductor film which is located at the bottom of the recessed portion to a desired thickness; forming an insulating film to cover the thinned portion of the semiconductor film; and forming a gate electrode over the thinned portion of the semiconductor film with the insulating film interposed therebetween.

According to the method for manufacturing a semiconductor device of the present invention similar to the above, the semiconductor film formed over the insulator is doped with the impurity element to a depth smaller than the thickness of the semiconductor film, thereby forming the impurity doped layer; the metal silicide layer is formed on the impurity doped layer; then, the metal silicide layer and the semiconductor film are etched to form the recessed portion; and the portion of the semiconductor film (i.e., the non impurity doped layer) which is located at the bottom of the recessed portion is thinned to be the channel formation region, so that the metal silicide layers and the channel formation region are located at different heights, which effectively prevents the metal silicide from entering the channel formation region; thus, transistors can be manufactured in a high yield. Further, since the metal silicide layer is formed on the semiconductor film that has a relatively large thickness before forming the recessed portion, demand for manufacture accuracy of the metal silicide layer can be decreased, which also contributes to improving the yield of transistors. Furthermore, since the gate electrode is formed over the thinned portion of the semiconductor film which is located at the bottom of the recessed portion of the semiconductor film with the insulating film interposed therebetween (a top gate structure), there is no limitation on the gate electrode unlike a case of a bottom gate structure. Furthermore, it is also possible to apply this method to an SOI substrate.

Only the channel formation region that is located at the bottom of the recessed portion is thinned, and the impurity doped layers on both sides of the recessed portion that function as a source region and a drain region are not thinned, and thus the source region and the drain region have a larger thickness than the channel formation region. Accordingly, a semiconductor device whose subthreshold swing is improved (that is to say, the subthreshold swing is decreased) can be achieved without a problem which is caused in thinning a source region and a drain region. With the subthreshold swing decreased, the semiconductor device can be driven at a low threshold voltage; thus, power consumption can be suppressed by decreasing power voltage with operation speed of the semiconductor device maintained.

Further, according to the present invention, a method for manufacturing a semiconductor device is provided which includes the steps of forming a semiconductor film over an insulator, using a semiconductor material including silicon; forming a metal silicide layer on an upper surface of the semiconductor film; patterning the metal silicide layer and the semiconductor film by etching, thereby forming a recessed portion at a position corresponding to a channel formation region of the semiconductor device, and thinning a portion of the semiconductor film which is located at the bottom of the recessed portion to a desired thickness; forming an insulating film to cover the thinned portion of the semiconductor film; forming a gate electrode over the thinned portion of the semiconductor film with the insulating film interposed therebetween; and doping portions of the semiconductor film which are located under metal silicide layers with an impurity element, through the metal silicide layers, using the gate electrode as a mask, thereby forming an impurity doped layer with a larger thickness than that of the thinned portion of the semiconductor film which is located at the bottom of the recessed portion.

According to the method for manufacturing a semiconductor device of the present invention similar to the above, the metal silicide layer is formed on the semiconductor film; then, the metal silicide layer and the semiconductor film are etched to form the recessed portion; and the portion of the semiconductor film (i.e., a non impurity doped layer) which is located at the bottom of the recessed portion is thinned to be the channel formation region, so that the metal silicide layers and the channel formation region are located at different heights, which effectively prevents the metal silicide from entering the channel formation region; thus, transistors can be manufactured in a high yield. Further, since the metal silicide layer is formed on the semiconductor film that has a relatively large thickness before forming the recessed portion, demand for manufacture accuracy of the metal silicide layer can be decreased, which also contributes to improving the yield of transistors. Furthermore, since the gate electrode is formed over the thinned portion of the semiconductor film which is located at the bottom of the recessed portion of the semiconductor film with the insulating film interposed therebetween (a top gate structure), there is no limitation on the gate electrode unlike a case of a bottom gate structure. Furthermore, it is also possible to apply this method to an SOI substrate. In addition, portions of the semiconductor film which are located under the metal silicide layers are doped with an impurity element through the metal silicide layers, using the gate electrode as a mask, thereby forming a source region and a drain region; thus, the source region and the drain region can be formed in a self-aligned manner with the gate electrode.

Only the channel formation region that is located at the bottom of the recessed portion is thinned, and the impurity doped layers on both sides of the recessed portion that function as a source region and a drain region are not thinned, and thus the source region and the drain region have a larger thickness than the channel formation region. Accordingly, a semiconductor device that has an improved subthreshold swing (that is to say, the subthreshold swing is decreased) can be achieved without the problems that are caused by thinning a source region and a drain region. With the subthreshold swing decreased, the semiconductor device can be driven at a low threshold voltage; thus, power consumption can be suppressed by decreasing power voltage with operation speed of the semiconductor device maintained.

According to an embodiment of the present invention, the step of patterning the metal silicide layer and the semiconductor film by etching can include the steps of etching the metal silicide layer isotropically using a resist as a mask that has an opening whose length in a channel length direction is exactly or almost the same as the length of the gate electrode, thereby exposing a portion of the semiconductor film which is located under the metal silicide film; and etching the exposed portion of the semiconductor film anisotropically using the resist having the opening as a mask. By etching the metal silicide layer isotropically in such a manner, the metal silicide layer is side-etched, so that a region which is wider than the opening formed in the resist is etched away. As a result, the distance between the metal silicide layer on the source region and the metal silicide layer on the drain region becomes larger than the distance between the source region and the drain region; thus, even when a gate electrode that has exactly or almost the same length (in a channel length direction) as the distance between the source region and the drain region is formed, sufficient distance can be obtained between the metal silicide layers and the gate electrode, thereby preventing leakage current between the gate electrode and the metal silicide layers.

According to another embodiment of the present invention, the step of patterning the metal silicide layer and the semiconductor film by etching can include the steps of forming a resist to cover the metal silicide layer; exposing the resist to light and developing the resist using a half-tone mask, thereby forming a patterned resist which has an opening at a position corresponding to a channel formation region of the semiconductor device, portions with a relatively small thickness at portions adjacent to the opening, and portions with a relatively large thickness at outer sides of and adjacent to the portions with a relatively small thickness; and etching the metal silicide layer and the semiconductor film using the patterned resist. Thus, the distance between the metal silicide layer on the source region and the metal silicide layer on the drain region becomes larger than the distance between the source region and the drain region; consequently, even when a gate electrode that has exactly or almost the same length (in a channel length direction) as the distance between the source region and the drain region is formed, sufficient distance can be obtained between the metal silicide layers and the gate electrode, thereby preventing leakage between the gate electrode and the metal silicide layers.

Preferably, the steps of forming a sidewall film to cover surfaces of the patterned metal silicide layer and the patterned semiconductor film and etching the sidewall film so that a portion of the sidewall film which is along a side surface of the recessed portion can remain as a sidewall and the thinned portion of the semiconductor film can be exposed can be carried out after the step of patterning the metal silicide layer and the semiconductor film by etching; the step of forming the insulating film to cover the thinned portion of the semiconductor film can be carried out after the step of etching the sidewall film. The sidewall film can be formed using silicon oxide, silicon nitride, silicon oxynitride (SiON), silicon nitride oxide (SiNO), or the like. Note that a silicon oxynitride film means a film which includes more oxygen than nitrogen (oxygen-rich) and a silicon nitride oxide film means a film which includes more nitrogen than oxygen (nitrogen-rich). Forming the sidewall in such a manner prevents leakage between the gate electrode and the metal silicide layers more reliably.

Preferably, the step of forming the sidewall film includes the steps of forming a first sidewall film using one of silicon oxynitride and silicon nitride oxide, and forming a second sidewall film over the first sidewall film, using the other of the silicon oxynitride and the silicon nitride oxide; and the step of etching the sidewall film includes the steps of etching the second sidewall film so that a portion of the second sidewall film which is along the side surface of the recessed portion can remain, to make the remaining portion of the second sidewall film a sidewall, and removing a portion of the first sidewall film which is not covered with the second sidewall film by etching, thereby exposing the thinned portion of the semiconductor film. By forming the sidewall film with a stacked-layer structure including the silicon oxynitride film and the silicon nitride oxide film, the etching can be stopped at appropriate timing because the wavelength of plasma light emission of the silicon oxynitride film in etching is different from that of the silicon nitride oxide film. Thus, damage or reduction in thickness of a portion of the semiconductor film thereunder can be prevented. In this case, a silicon nitride can also be used instead of silicon nitride oxide.

According to another aspect of the present invention, a semiconductor device is provided which includes a semiconductor film which is formed over an insulator, is provided with a recessed portion at a portion corresponding to a channel formation region of the semiconductor device, and includes a non impurity doped layer, which is not doped with an impurity element, at a portion located at the bottom of the recessed portion; an insulating film which covers the non impurity doped layer which is located at the bottom of the recessed portion; a gate electrode which is formed over the non impurity doped layer which is located at the bottom of the recessed portion, with the insulating film interposed therebetween; a pair of metal silicide layers which are formed on portions of the semiconductor film which are located next to the recessed portion and form side surfaces of the recessed portion; and a pair of impurity doped layers which are formed under and in contact with the pair of metal silicide layers and function as a source region and a drain region of the semiconductor device.

According to such a semiconductor device of the present invention, since the non impurity doped layer that is located at the bottom of the recessed portion of the semiconductor film functions as a channel formation region, and since the metal silicide layers are formed on top surfaces of portions of the semiconductor film which form side surfaces of the recessed portion, the metal silicide layers and the channel formation region are located at different heights, which effectively prevents the metal silicide from entering the channel formation region; thus, semiconductor devices can be manufactured in a high yield. Further, since the gate electrode is formed over the thinned portion of the semiconductor film which is located at the bottom of the recessed portion of the semiconductor film with the insulating film interposed therebetween (a top gate structure), there is no limitation on the gate electrode unlike a case of a bottom gate structure. Furthermore, this semiconductor device can also be formed using an SOI substrate.

Preferably, the thickness of the non impurity doped layer which is located at the bottom of the recessed portion is smaller than the thickness of the pair of impurity doped layers which function as the source region and the drain region. By making the thickness of the non impurity doped layer, which functions as the channel formation region, smaller than that of the pair of impurity doped layers, which function as the source region and the drain region, in such a manner, sub-threshold swing can be improved; thus, operation speed of the semiconductor device can be increased and power consumption can be reduced.

Further, the distance between the metal suicide layer on the source region and the metal silicide layer on the drain region can be longer than the distance between the source region and the drain region. Thus, even when the gate electrode has a length (in a channel length direction) that is exactly or almost the same as the distance between the source region and the drain region, sufficient distance can be obtained between the metal silicide layers and the gate electrode, thereby preventing leakage between the gate electrode and the metal silicide layers.

Preferably, the semiconductor device further has a sidewall along the side surface of the recessed portion of the semiconductor film. Such a sidewall can prevent leakage between the gate electrode and the metal silicide layers more reliably.

According to a method for manufacturing a semiconductor device of the present invention, a metal silicide layer is formed on an impurity doped layer of a semiconductor film; then, the metal silicide layer and the semiconductor film are etched to form a recessed portion; and a portion of the semiconductor film (i.e., a non impurity doped layer) which is located at the bottom of the recessed portion is thinned to be a channel formation region, so that metal silicide layers and the channel formation region are located at different heights, which effectively prevents the metal silicide from entering the channel formation region; thus, transistors can be manufactured in a high yield.

According to a semiconductor device of the present invention, since a non impurity doped layer that is located at the bottom of a recessed portion of a semiconductor film functions as a channel formation region and metal silicide layers are formed on top surfaces of portions of the semiconductor film which form side surfaces of the recessed portion, the metal silicide layers and the channel formation region are located at different heights, which effectively prevents the metal silicide from entering the channel formation region; thus, semiconductor devices can be manufactured in a high yield.

DETAILED DESCRIPTION OF THE INVENTION

FIGS. 1A to 1J are cross-sectional views showing a method for manufacturing a semiconductor device (TFT) based on a preferred embodiment of the present invention.

Figure 1A:
FIGS. 1A to 1J are cross-sectional views for showing a preferred embodiment of a method for manufacturing a semiconductor device based on the present invention.

First, as shown in FIG. 1A, a semiconductor film 2 is formed over an insulating substrate 1, using a semiconductor material including silicon. As the insulating substrate 1, a glass substrate, a quartz substrate, a heat-resistant plastic substrate, or the like can be used. If a glass substrate is used, it is preferable that a base film be formed on a surface of the glass substrate in order to prevent impurity ions (e.g., of Na) from the glass substrate from entering the semiconductor film 2. Further, as the insulating substrate 1, it is also possible to use a single crystalline silicon substrate or a metal substrate whose surface is provided with an insulating base film. Such a base film is only required to be formed of an insulating material having a heat-resistant property and a chemical-resistant property which are necessary in a later film formation process; for example, silicon nitride, silicon oxynitride, silicon oxide, silicon nitride oxide, or the like can be used. In this specification, a silicon oxynitride film (a SiON film) includes more oxygen than nitrogen, and a silicon nitride oxide film (a SiNO film) includes more nitrogen than oxygen. Such a film can preferably be formed by a chemical vapor deposition method (a CVD method). Further, the base film may include a plurality of stacked layers instead of a single layer. For example, when the semiconductor film in which a source region and a drain region are formed is formed of polycrystalline silicon, there is a problem in that a dangling bond tends to generate a trap level at the interface between polycrystalline silicon and silicon nitride, or adhesion is poor because silicon nitride has high internal stress; therefore, it is preferable that after forming a silicon nitride film over a surface of a substrate, a silicon oxide film be formed thereover and a polycrystalline silicon film be formed over the silicon oxide film. In general, it is preferable that the thickness of the base film be from 30 nm to 300 nm. Formation of the base film can be omitted depending on the kind of the substrate, for example, in a case of using a quartz substrate, with which there is no concern that impurities enter a semiconductor film. As described above the insulating substrate 1 is only required to have an insulating surface so that a semiconductor film can be formed thereover, and the entire insulating substrate 1 is not necessarily formed of an insulating material.

As the semiconductor material including silicon, polycrystalline silicon can be used, for example. Polycrystalline silicon can be obtained by forming an amorphous silicon film by a CVD method or the like using a semiconductor source gas such as silane ($SiH_4$) and then crystallizing the amorphous silicon film by a laser crystallization method or the like. If the substrate has high heat resistance, e.g., in a case where a quartz substrate is used as the substrate 1, a thermal crystallization method may be used instead of a laser crystallization method. It is also possible to use a catalytic element for promoting crystallization, such as Ni. Further, single crystalline silicon or the like can also be used instead of polycrystalline silicon. Furthermore, an SOI substrate in which a single crystalline silicon layer is formed on an insulator (e.g., silicon oxide) using an SOI technique can also be used.

Subsequently, in a step shown in FIG. 1B, the semiconductor film 2 is doped with an impurity element to a depth smaller than the thickness of the semiconductor film 2 at a high concentration (heavy dope), for example, by a plasma doping method or an ion implantation method to form an impurity doped layer 3 and a layer which is not doped with the impurity element (referred to as a non impurity doped layer) 4 under the impurity doped layer 3. For the impurity element with which the semiconductor film 2 is doped, a material suitable for a desired conductivity type is used. As an impurity element which imparts N-type conductivity, an element which belongs to Group 15 is preferably used; for example, phosphorus (P) or arsenic (As) can be used. As an impurity element which imparts P-type conductivity, boron (B) is used in general.

Figure 1B:
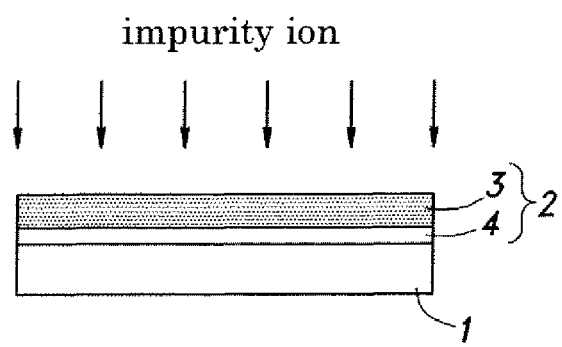
Figure 1C:
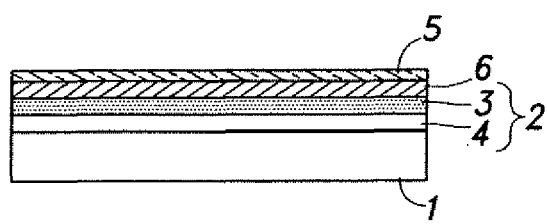

Next, as shown in FIG. 1C, a metal film 5 is formed on the semiconductor film 2, using titanium (Ti), cobalt (Co), nickel (Ni), or the like, for example, by a sputtering method. Then, the metal film 5 and the semiconductor film 2 undergo heat treatment to diffuse the metal into the semiconductor film 2 including silicon, whereby the metal and the silicon react with each other to form a metal silicide layer 6 on an upper surface of the semiconductor film 2. It is also possible to diffuse the silicon in the semiconductor film 2 into the metal film 5 to form the metal silicide layer 6.

Figure 1D:
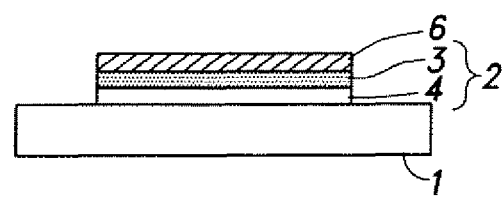

Then, as shown in FIG. 1D, the metal film 5 is removed by etching or the like. Subsequently, dry etching is carried out using an appropriate mask (not illustrated) to process the semiconductor film 2 including the metal silicide layer 6 into an island shape. As an etching gas for the dry etching, a fluorine-based gas such as $CF_4$, $NF_3$, $SF_6$, $CHF_3$, or $CF_4$, or a mixed gas in which an $O_2$ gas, a $H_2$ gas, or an inert gas such as He or Ar is added to a fluorine-based gas as appropriate, or the like can be used. It is preferable to use a mixed gas of $CF_4$ and $O_2$, a mixed gas of $SF_6$ and $O_2$, a mixed gas of $CHF_3$ and He, or a mixed gas of $CF_4$ and $H_2$. Further, the etching method is not limited to dry etching, and wet etching may also be employed. In a case where a semiconductor film formed of a polycrystalline silicon film is wet-etched, it is preferable to use an organic alkaline aqueous solution typified by tetramethylammonium hydroxide (TMAH). When TMAH or the like is used as an etching solution, only the semiconductor film formed of polycrystalline silicon is etched as selected, and thus etching can be carried out without damaging the base insulating layer.

Figure 1E:
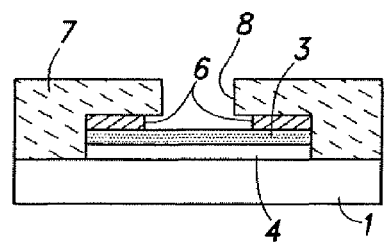

In a step shown in FIG. 1E, a resist 7 is formed to cover the island-shaped semiconductor film 2 and metal silicide layer 6. The resist 7 is exposed to light using an appropriate mask, which is not illustrated, to be patterned, so that an opening 8 is formed at a position which is exactly or almost in alignment with a channel formation region, and the resist 7 remains at positions which are exactly or almost in alignment with a source region and a drain region, one located on each side of the channel formation region. In this embodiment, the length of the opening 8 is exactly or almost the same as the length of a gate electrode that is formed later in a channel length direction. Isotropic wet etching is carried out to pattern the metal silicide layer 6 using the patterned resist 7 as a mask, thereby exposing the impurity doped layer 3 under the metal silicide layer 6. As shown in the drawing, by employing isotropic wet etching, the metal silicide layer 6 is side-etched (that is to say, the metal silicide layer 6 is etched not only in a direction perpendicular to a substrate plane but also in a direction parallel to the substrate plane), so that a wider region than the opening 8 formed in the resist 7 is etched away.

Subsequently, in a step shown in FIG. 1F, the semiconductor film 2 (i.e., the impurity doped layer 3 and the non impurity doped layer 4) is etched by anisotropic dry etching such as reactive ion etching using the patterned resist 7, which has been used in the step shown in FIG. 1E, as a mask, so that a recessed portion 13 is formed. Anisotropic etching enables the impurity doped layer 3 and the non impurity doped layer 4 to be etched exactly or almost in alignment with the opening pattern formed in the resist 7. At this time, the etching rate and time are controlled so that a portion of the non impurity doped layer 4 to be etched (that is, a portion located at the bottom of the recessed portion 13) may be thinned to an appropriate thickness This thinned portion of the semiconductor film 2 (the non impurity doped layer 4) functions as a channel formation region 12. Further, impurity doped layer 3, which is formed on both sides of the thinned non impurity doped layer 4 and which form side surfaces of the remaining recessed portion 13 in the semiconductor film 2, function as a source region 10 and a drain region 11. A distance D1 between the metal silicide layer 6 on the source region 10 and the metal silicide layer 6 on the drain region 11 is longer than a distance D2 between the source region 10 and the drain region 11 because the metal silicide layer 6 is side-etched as described above.

Figure 1F:
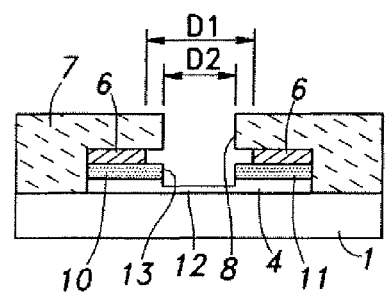
Figure 1G:
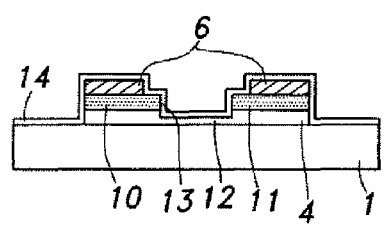

In a step shown in FIG. 1G, the resist 7 is removed, and then a gate insulating film 14 is formed, for example, by a CVD method to cover an entire surface. As a material of the gate insulating film 14, silicon nitride, silicon oxynitride, silicon oxide, silicon nitride oxide, or the like can be used in a similar manner to the above-described base film.

Figure 1H:
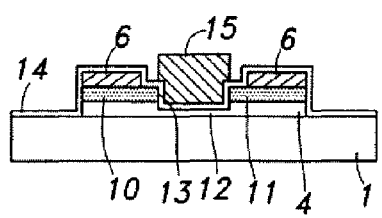

Next, as shown in FIG. 1H, a gate electrode 15 is formed over the thinned non impurity doped layer 4 (i.e., the channel formation region 12) in the recessed portion 13 of the semiconductor film 2, with the gate insulating film 14 interposed therebetween. In other words, in the present invention, a "top gate structure," in which the gate electrode is formed over the semiconductor film 2, is formed. Therefore, there is no limitation on the gate electrode 15 unlike a case of a bottom gate structure; the material of the gate electrode can be selected from various conductive materials. For example, the gate electrode 15 can be formed using tantalum (Ta), tungsten (W), titanium (Ti), molybdenum (Mo), aluminum (Al), copper (Cu), chromium (Cr), niobium (Nb), or the like or an alloy or a compound material including such an element as a main component. Further, it is also possible to use conductive crystalline silicon. In order to form the gate electrode 15, first, the above material is deposited by a sputtering method. Subsequently, a photoresist (not illustrated) is applied to the deposited film, and is patterned by light exposure and development, and then the film of the gate material is etched by dry etching, wet etching, or the like using the patterned photoresist as a mask. The photoresist is removed after the etching. Instead of carrying out light exposure and development to the photoresist, patterning can also be carried out with an inkjet apparatus or the like. In this example, the length of the gate electrode 15 in a channel length direction (the length in a horizontal direction in the drawings) is exactly or almost the same as the direction D2 between the source region 10 and the drain region 11.

Figure 1I:
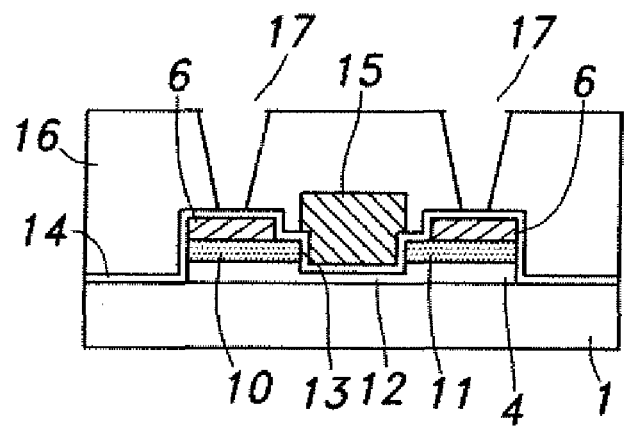

Subsequently, as shown in FIG. 1I, an interlayer insulating film 16 is formed over a surface, and then opening portions (contact holes) 17 that reach the source region 10 and the drain region 11 are formed by etching, for example. The interlayer insulating film 16 can be formed using a similar material to that described in forming the base film or the gate insulating film 14, for example. Further, the interlayer insulating film 16 may be formed using an organic material (e.g., polyimide or polyamide) by a droplet discharge method (an inkjet method) or a spin coating method. A spin coating method has an advantage that a surface of the interlayer insulating film 16 can be easily planarized. Furthermore, it is also possible to deposit an inorganic material as the interlayer insulating film 16 and then planarize a surface of the interlayer insulating film 16 by a chemical mechanical polishing method (a CMP method). If a droplet discharge method is used, the opening portions 17 can be formed directly, and thus a step of forming the opening portions 17 separately can be omitted.

Figure 1J:
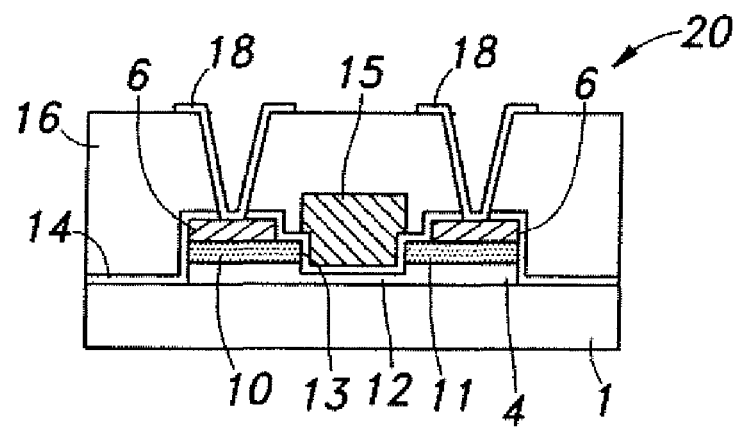

Then, as shown in FIG. 1J, conductive films 18 that form wirings connected to the metal silicide layers 6 on the source region 10 and the drain region 11 are formed, so that a TFT 20 can be obtained. Any material can be used for the conductive films 18 as long as it has conductivity. For example, the above material of the gate electrode 15 may be deposited by a sputtering method and patterned as appropriate, so that the conductive film 18 can be formed.

As described above, according to a method for manufacturing a semiconductor device (TFT) based on a preferred embodiment of the present invention, the semiconductor film 2 formed over the insulating substrate 1 is doped with the impurity element to a depth smaller than the thickness of the semiconductor film 2 to form the impurity doped layer 3; the metal silicide layer 6 is formed on the impurity doped layer 3; the metal silicide layer 6 and the semiconductor film 2 are etched to form the recessed portion 13; the portion of the semiconductor film 2 which is located at the bottom of the recessed portion 13 (i.e., the non impurity doped layer 4) is thinned to be the channel formation region 12, so that the metal silicide layers 6 are formed at a different height from the channel formation region 12, which effectively prevents the metal silicide from entering the channel formation region 12. Further, demand for manufacture accuracy of the metal silicide layer 6 can be decreased because the metal silicide layer 6 is formed on the semiconductor film 2 that has a relatively large thickness before forming the recessed portion 13. Thus, transistors can be manufactured in a high yield.

Further, only the channel formation region 12 is thinned and the source region 10 and the drain region 11 have a larger thickness than the channel formation region; thus, a semiconductor device whose subthreshold swing is improved (that is to say, the subthreshold swing is decreased) can be achieved without a problem which is caused in thinning a source region and a drain region. With the subthreshold swing decreased, the semiconductor device can be driven at a low threshold voltage; thus, power consumption can be suppressed by decreasing power source voltage with operation speed of the semiconductor device maintained.

Further, in etching the metal silicide layer 6, isotropic wet etching is used to side-etch the metal silicide layer 6, whereby the distance D1 between the metal silicide layer 6 on the source region 10 and the metal silicide layer 6 on the drain region 11 is longer than the distance D2 between the source region 10 and the drain region 11; therefore, even when the gate electrode 15 that has exactly or almost the same length in a channel length direction as the distance D2 between the source region 10 and the drain region 11 is formed, sufficient distance can be obtained between the metal silicide layers 6 and the gate electrode 15, thereby preventing leakage current between the gate electrode 5 and the metal silicide layers 6.

Figure 2A:
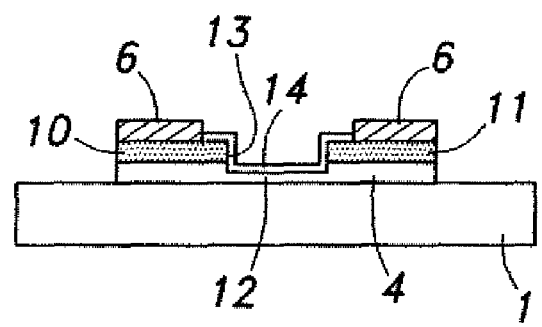
FIGS. 2A to 2C are cross-sectional views for showing another embodiment of a method for manufacturing a semiconductor device based on the present invention.
Figure 2B:
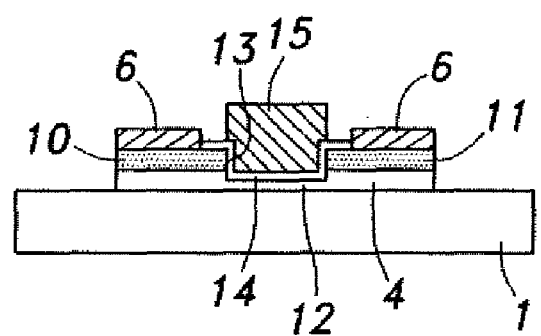
Figure 2C:
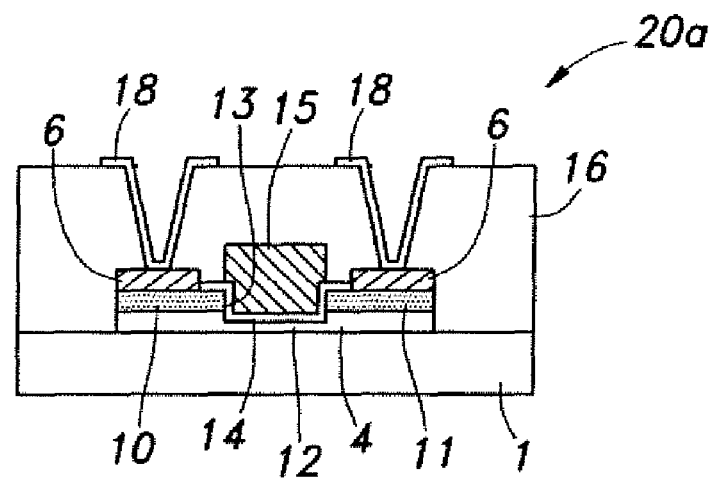

In the above embodiment, in the step shown in FIG. 1G, the gate insulating film is formed by a CVD method to cover the entire surface. However, it is also possible that only exposed surfaces of the impurity doped layer 3 and the thinned non impurity doped layer 4 (12) are oxidized by thermal oxidation to form a gate insulating film 14a as shown in FIG. 2A. Also in that case, in a similar manner to the above embodiment, the gate electrode 15 is formed in the recessed portion 13 (see FIG. 23) and the interlayer insulating film 16, the opening portions 17, and the conductive films 18 are formed, so that a TFT 20a as shown in FIG. 2C can be formed.

FIGS. 3A to 3D are cross-sectional views illustrating a method for manufacturing a semiconductor device (TFT) according to another embodiment of the present invention. In this embodiment, elements similar to those in the above embodiment are indicated by the same reference numerals, and detailed description thereof is omitted.

Figure 3A:
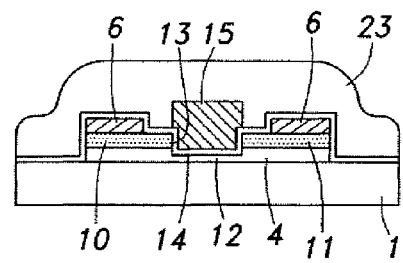
FIGS. 3A to 3D are cross-sectional views for showing another embodiment of a method for manufacturing a semiconductor device based on the present invention.

In this embodiment, first, through steps similar to those shown in FIGS. 1A to 1H, the structure shown in FIG. 1H is obtained. Then, as shown in FIG. 3A, a SiON film 23 is formed as a sidewall film to cover the surface of the structure shown in FIG. 1H, for example, by a CVD method. Note that this embodiment is different from the above embodiment in that the concentration of the impurity element in the impurity doped layer 3 is low; as a result, the concentration of the impurity element in the source region 10 and the drain region 11 is low in FIG. 3A.

Figure 3B:
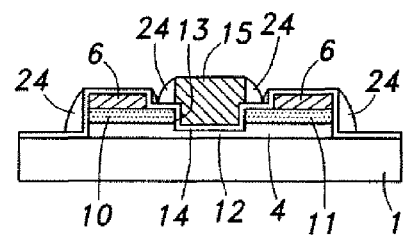

Subsequently, as shown in FIG. 3B, the SiON film 23 is etched to form a sidewall 24 that covers side surfaces of the gate electrode 15 or the like. In general, a mask is not necessary in this etching process.

Figure 3C:
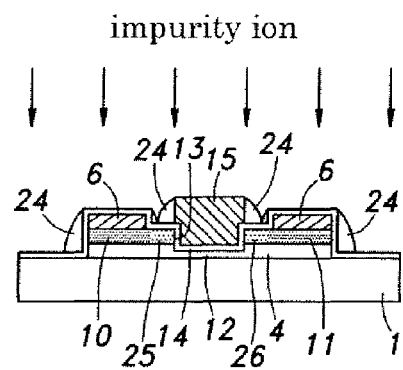

Then, as shown in FIG. 3C, the source region 10 and the drain region 11 are doped with an impurity element at a high concentration using the sidewall 24 and the gate electrode 15 as a mask. At this time, the thickness and the width of the sidewall 24 that covers the side surfaces of the gate electrode 15 or the like is appropriately controlled, whereby parts of the source region 10 and the drain region 11 which are located under the sidewall 24 can remain at a low concentration; thus, low-concentration doped regions (also referred to as LDD regions) 25 and 26 are formed.

Figure 3D:
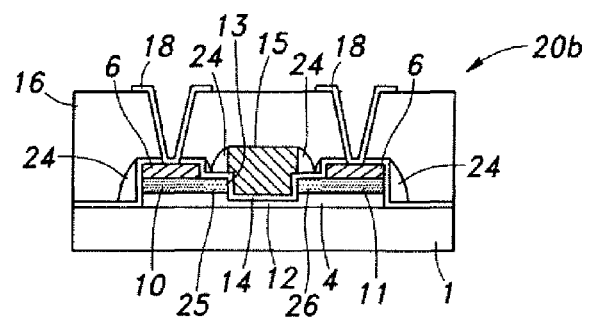

After that, through steps similar to those shown in FIGS. 1I and 1J, the interlayer insulating film 16, the opening portions 17, and the conductive films IS are formed, so that a TFT 20b as shown in FIG. 3D is manufactured.

In this embodiment, provision of the LDD regions 25 and 26 has an advantage that an off current of the TFT 20b can be reduced or deterioration of the TFT 20b which is due to hot carriers can be prevented, or the like. Although the SiON film is used as the sidewall film, it is also possible to use a SiNO film, a silicon oxide film, or a silicon nitride film. Further, the structure of the sidewall film is not limited to a single layer, and stacked layers may also be employed.

FIGS. 4A to 4G are cross-sectional views illustrating a method for manufacturing a semiconductor device (TFT) according to another embodiment of the present invention. In this embodiment, elements similar to those in the above embodiments are indicated by the same reference numerals, and detailed description thereof is omitted.

Figure 4A:
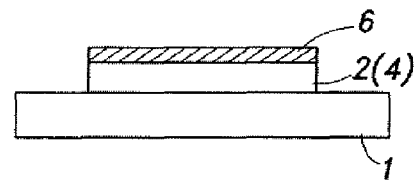
FIGS. 4A to 4G are cross-sectional views for showing another embodiment of a method for manufacturing a semiconductor device based on the present invention.

In this embodiment, steps shown in FIGS. 1A to 1D are carried out without the doping step shown in FIG. 1B, and an island-shaped semiconductor film 2 having a surface provided with the metal silicide layer 6 is formed as shown in FIG. 4A. This island-shaped semiconductor film 2 does not have the impurity doped layer 3, and the non impurity doped layer 4, to which an impurity is not added, is present under the metal silicide layer 6.

Figure 4B:
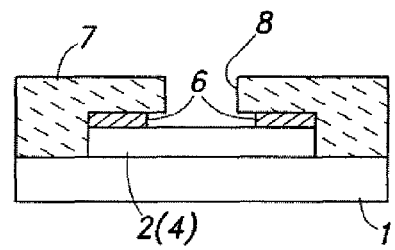

In a step shown in FIG. 4B, in a similar manner to the step shown in FIG. 1E, the resist 7 is formed to cover the island-shaped semiconductor film 2 and metal silicide layer 6 and is patterned, and then the metal silicide layer 6 is etched isotropically using the patterned resist 7 as a mask.

Figure 4C:
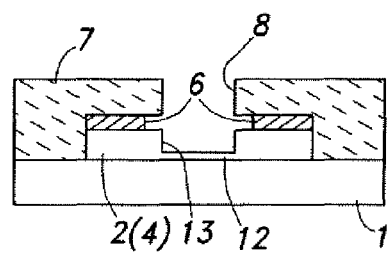

In a step shown in FIG. 4C, in a similar manner to the step shown in FIG. 1F, the semiconductor film 2 (the non impurity doped layer 4) is patterned in accordance with the pattern of the resist 7 by anisotropic etching, thereby defining the recessed portion 13 and thinning a part of the semiconductor film 2 which is located at the bottom of the recessed portion 13 to form the channel formation region 12.

Figure 4D:
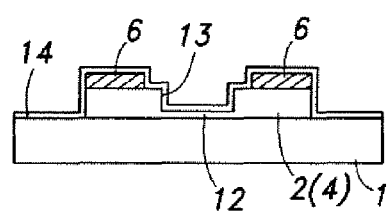
Figure 4E:
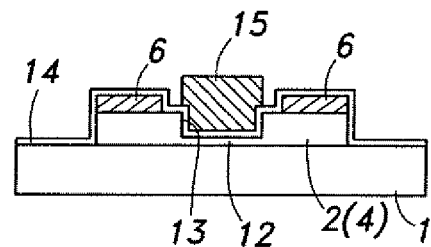

Next, as shown in FIG. 4D, in a similar manner to the step shown in FIG. 1G, the gate insulating film 14 is formed to cover the entire surface, for example, by a CVD method. Then, as shown in FIG. 4E, the gate electrode 15 is formed in the recessed portion 13 over the insulating film 14 which covers the channel formation region 12.

Figure 4F:
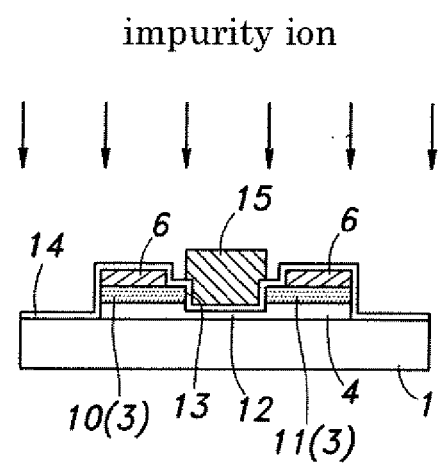

In a step shown in FIG. 4F, using the gate electrode 15 as a mask, the semiconductor film 2 undergoes heavy doping with an impurity element, so that the impurity doped layers 3, which function as the source region 10 and the drain region 11, are formed in the semiconductor film 2. At this time, the semiconductor film 2 is doped with the impurity element to a given depth through the gate insulating film 14 and the metal silicide layers 6. Although the impurity element does not reach a bottom surface of the semiconductor film 2 in the example shown in FIG. 4F, impurity doping may be carried out in such a manner that the impurity element can reach the bottom surface of the semiconductor film 2. In that case, by making part of the added impurity element enter the channel formation region 12, an LDD region with a low concentration can be formed.

Figure 4G:
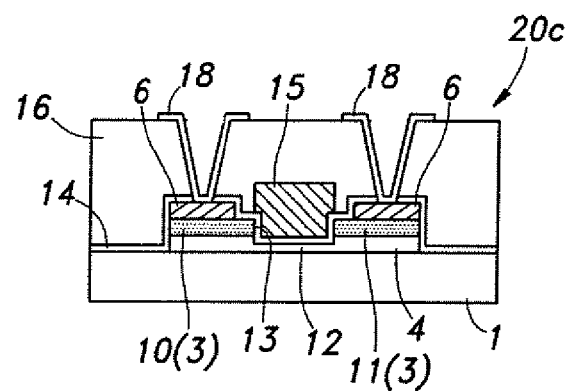

After that, in a similar manner to the steps shown in FIGS. 1I and 1J, the surface is covered with the interlayer insulating film 16, and the opening portions 17 and the conductive films 18 are formed, so that a TFT 20c as shown in FIG. 4G is manufactured.

As described above, the doping of the semiconductor film 2 with the impurity element, which is carried out in order to form the impurity doped layer 3 for functioning as the source region 10 and the drain region 11, may be performed after patterning the semiconductor film 2 to thin the portion corresponding to the channel formation region 12. In that case, it is preferable to use the gate electrode 15 as a mask as described above and perform the impurity doping, which enables the source region 10 and the drain region 11 to be self-aligned with the gate electrode 15.

FIGS. 5A to 5F are cross-sectional views illustrating a method for manufacturing a semiconductor device (TFT) according to another embodiment of the present invention. In this embodiment, elements similar to those in the above embodiments are indicated by the same reference numerals, and detailed description thereof is omitted.

Figure 5A:
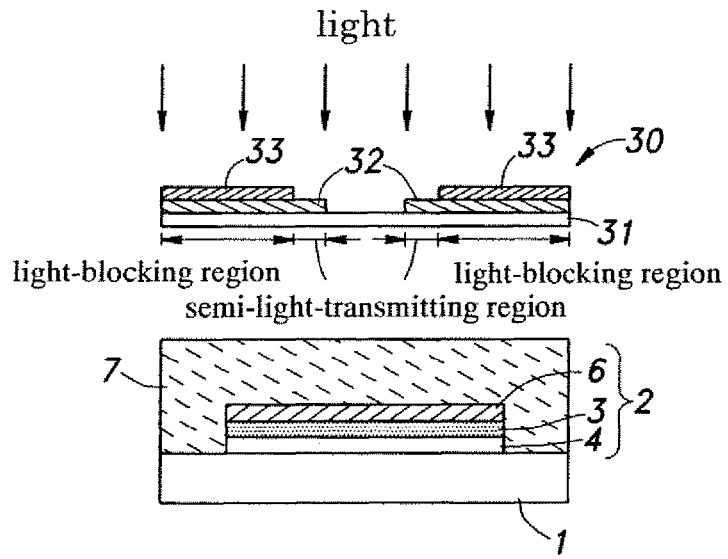
FIGS. 5A to 5F are cross-sectional views for showing another embodiment of a method for manufacturing a semiconductor device based on the present invention.

In this embodiment, after the structure shown in FIG. 1D is formed through the steps shown in FIGS. 1A to 1D, the resist 7 is formed to cover the surface as shown in FIG. 5A. When this resist 7 is exposed to light, a half-tone mask 30 as shown in FIG. 5A is used.

In the half-tone mask 30 shown in FIG. 5A, a semi-light-transmitting film 32 is formed over a transparent quartz plate 31, which is a mask substrate, except over a center portion. Further, a light-blocking film 33, which blocks incident light, is partly formed over the semi-light-transmitting film 32. The resist is exposed to light and developed using such a half-tone mask 30, whereby the thickness of the resist 7 can vary according to the position.

Figure 5B:
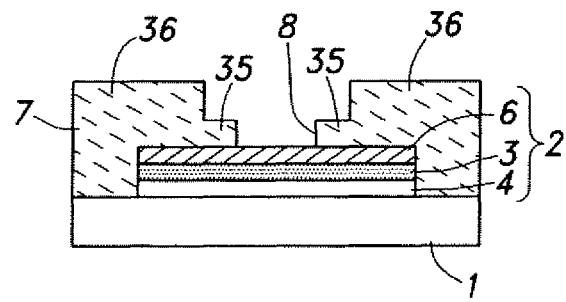

In this embodiment, the half-tone mask 30 has a light-transmitting region in the center portion thereof, a semi-light-transmitting region on both sides of the light-transmitting region, and a light-blocking region at an outer side of the semi-light-transmitting region. The resist 7 is exposed to light and developed using such a half-tone mask 30, whereby the patterned resist 7 is formed in which an opening 8 is formed to expose a surface of the metal silicide layer 6 in the center portion, and a portion 35 having a relatively small thickness on both sides of the opening 8, and a portion 36 having a relatively large thickness at an outer side of the portion 35, as shown in FIG. 5B.

Figure 5C:
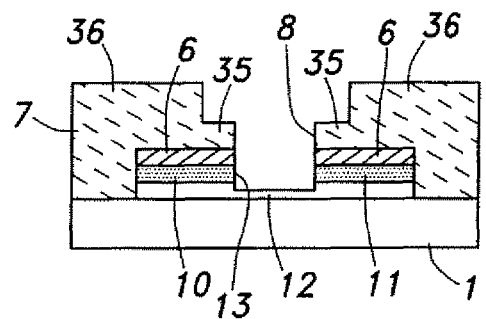

In a step shown in FIG. 5C, using the patterned resist 7 as a mask, the metal silicide layer 6, the impurity doped layer 3, and the non impurity doped layer 4 are etched anisotropically in accordance with the opening pattern of the resist 7, thereby forming the recessed portion 13 to define the source region 10 and the drain region 11. At this time, in a similar manner to the above embodiments, the etching rate and time are controlled so that the non impurity doped layer 4 to be etched can be thinned to a given thickness. In this etching, the etching rates of the metal silicide layer 6, the impurity doped layer 3, and the non impurity doped layer 4 are higher (i.e., the etching selectivity is higher) than the etching rate of the resist 7, and thus the shape of the resist 7 hardly changes.

Figure 5D:
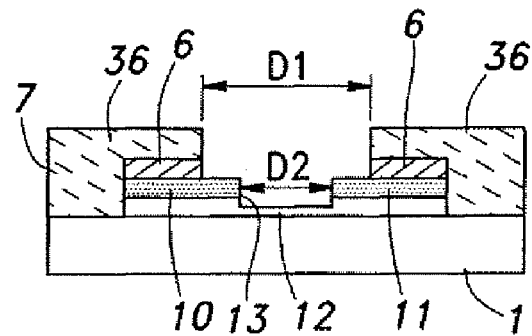

Subsequently, in a step shown in FIG. 5D, the metal silicide layers 6, together with the resist 7, are etched anisotropically. At this time, the etching is carried out in such a manner that portions of the metal silicide layers 6 which are covered with the thinned film portion 35 of the resist and correspond to the semi-light-transmitting region of the half-tone mask 30 are removed and the thick film portion 36 of the resist 7 and portions of the metal silicide layers 6 which are located under the portion 36 remain. Thus, the distance D1 between the metal silicide layer 6 on the source region 10 and the metal silicide layer 6 on the drain region 11 becomes longer than the distance D2 between the source region 10 and the drain region 11 by the length of the semi-light-transmitting regions of the half-tone mask 30. That is to say, in this embodiment, the distance between the metal silicide layer 6 on the source region 10 and the metal silicide layer 6 on the drain region 11 can be defined accurately by the lengths of the light-blocking regions and the semi-light-transmitting regions of the half-tone mask 30.

Figure 5E:
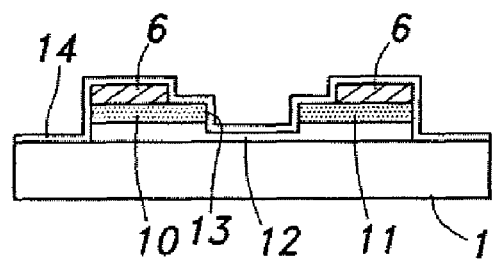

Then, in a step shown in FIG. 5E, in a similar manner to the step shown in FIG. 1G, the resist 7 is removed and the gate insulating film 14 is formed to cover the surface.

Figure 5F:
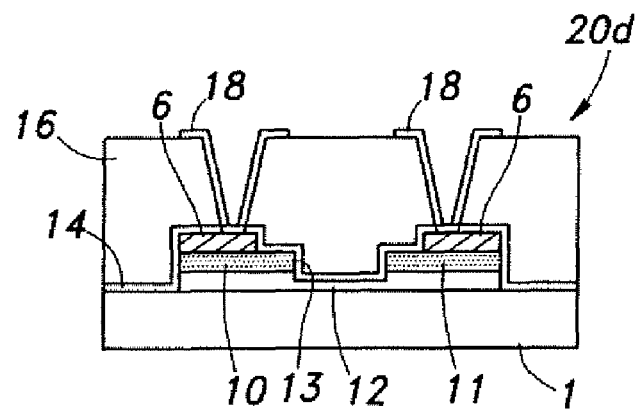
Figure 6:
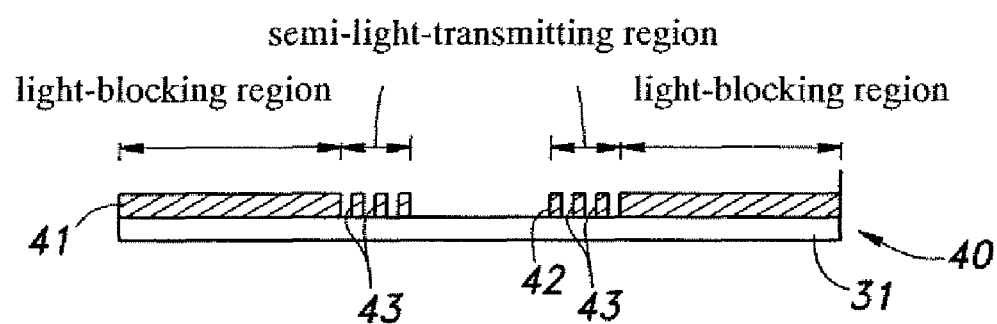
FIG. 6 is a cross-sectional view showing another embodiment of a half-tone mask.

After that, through steps similar to those shown in FIGS. 1I and 1J, the surface is covered with the interlayer insulating film 16, and the opening portions 17 and the conductive films 18 are formed, so that a TFT 20d as shown in FIG. 5F is manufactured, The half-tone mask is not limited to a half-tone mask having a semi-light-transmitting film as shown in FIG. 5A; it is also possible to use a porous half-tone mask 40 as shown in FIG. 6. The half-tone mask 40 shown in FIG. 6 has a layer 41 that is formed of a light-blocking material over the quartz plate 31; a light-transmitting region, in which an opening 42 is formed, in the center portion; semi-light-transmitting regions in which a plurality of slits 43 are provided on each side of the light-transmitting region; and light-blocking regions, in which neither an opening nor a slit is provided, at an outer side of the semi-light-transmitting regions. In a similar manner to the half-tone mask 30 having the semi-light-transmitting film as shown in FIG. 5A, the use of such a porous half-tone mask 40 in light exposure and development of the resist also makes it possible to change the thickness of the resist according to the position.

FIGS. 7A to 7D are cross-sectional views illustrating a method for manufacturing a semiconductor device (TFT) according to another embodiment of the present invention. In this embodiment, elements similar to those in the above embodiments are indicated by the same reference numerals, and detailed description thereof is omitted.

Figure 7A:
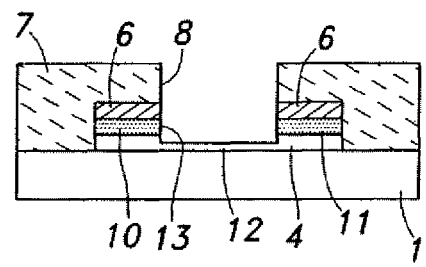
FIGS. 7A to 7D are cross-sectional views for showing another embodiment of a method for manufacturing a semiconductor device based on the present invention.
Figure 7B:
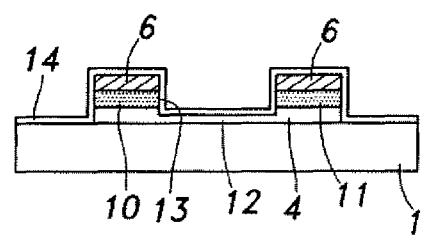
Figure 7C:
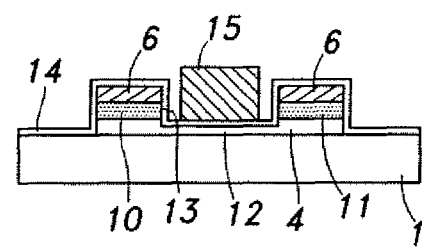

In this embodiment, after the structure shown in FIG. 1D is formed through the steps shown in FIGS. 1A to 1D, the resist 7 is formed to cover the surface and is patterned to form the opening 8, and the metal silicide layer 6, the impurity doped layer 3, and the non-impurity doped layer 4 are etched anisotropically in accordance with the opening pattern of the resist 7, using the patterned resist 7 as a mask, so that the recessed portion 13 is formed to define the source region 10 and the drain region 11, as shown in FIG. 7A. This embodiment is different from the embodiment shown in FIGS. 1A to 1J in that the length of the opening 8 in a channel length direction is larger than that of the gate electrode that is formed later In a step shown in FIG. 7B, in a similar manner to the step shown in FIG. 10G, the resist 7 is removed and the insulating film 14 is formed to cover the surface.

Figure 7D:
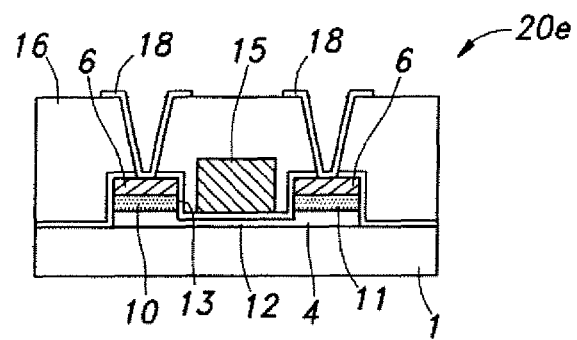

After that, through steps similar to those shown in FIGS. 1I and 1J, the surface is covered with the interlayer insulating film 16, and the opening portions 17 and the conductive films 18 are formed, so that a TUT 20e as shown in FIG. 7D is manufactured.

In this TFT 20e, since the length of the opening 8 of the resist 7, which is used as a mask in etching, is larger than that of the gate electrode 15 in a channel length direction, only anisotropic etching is carried out without the step of etching the metal silicide layer 6 isotropically, so that a sufficient distance can be obtained between the metal silicide layers 6 and the gate electrode 15, thereby preventing leakage therebetween. In the TFT 20e shown in FIG; 7D, however, on resistance can increase because distances between the source region 10 and the gate electrode, and between the drain region 11 and the gate electrode 15 are longer than those in the TFT 20 shown in FIG. 1J.

FIGS. 8A to 8G are cross-sectional views illustrating a method for manufacturing a semiconductor device (TFT) according to another embodiment of the present invention. In this embodiment, elements similar to those in the above embodiments are indicated by the same reference numerals, and detailed description thereof is omitted.

Figure 8A:
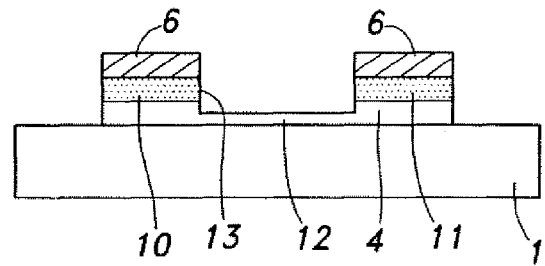
FIGS. 8A to 8G are cross-sectional views for showing another embodiment of a method for manufacturing a semiconductor device based on the present invention.

In this embodiment, after the metal silicide layer 6, the impurity doped layer 3, and the non impurity doped layer 4 are etched anisotropically to form the recessed portion 13 by the step described with reference to FIG. 7A, the resist 7 is removed and a structure shown in FIG. 8A is formed.

Figure 8B:
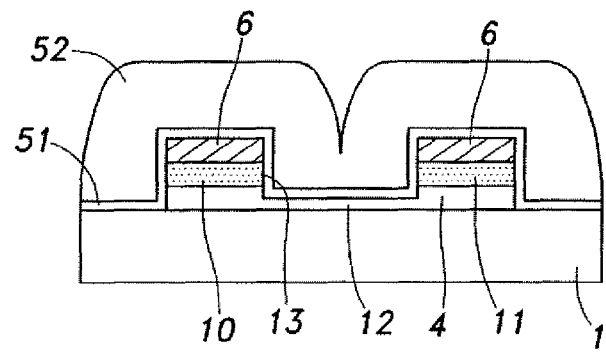

Subsequently, as shown in FIG. 8B, a SiNO film 51 is formed to cover a surface of the patterned metal silicide layer 6 and semiconductor film 2 (i.e., the source region 10, the drain region 11, and the channel formation region 12), and a SiON film 52 is formed thereover with a relatively large thickness. These SiNO film 51 and SiON film 52 function as sidewall films.

Figure 8C:
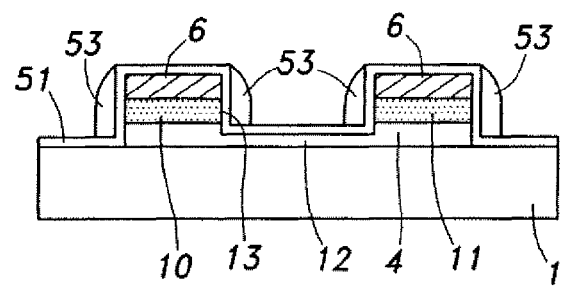

In a step shown in FIG. 8C, the SiON film 52 is etched, for example, by dry etching so that portions of the SiON film which are along side surfaces of the recessed portion 13 can remain as sidewalls 53. At this time, the SiNO film 51 functions as an etching stopper Specifically, the wavelength of plasma light emission of the SiON film 52 in etching is different from that of the SiNO film 51, which is utilized for stopping the etching when a surface of the SiNO film 51 is exposed Thus, damage (or to become amorphous) or reduction in thickness of the semiconductor film 2 (the channel formation region 12) can be prevented. Although the SiON film 52 is formed over the SiNO film 51 in this embodiment, the positions can be reversed. Further, a silicon nitride film can also be used instead of the SiNO film. Furthermore, the sidewall films can also be composed of a single layer of silicon oxide, silicon nitride, silicon oxynitride, silicon nitride oxide, or the like instead of stacked layers.

Figure 8D:
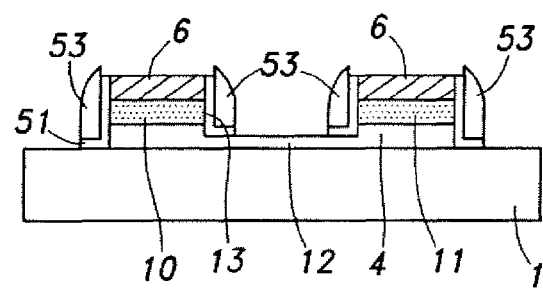

Subsequently, in a step shown in FIG. 8D, portions of the SiNO film 51 which are not covered with the sidewalls 53 and are exposed are etched away, so that the thinned non impurity doped layer 4 (the channel formation region 12) located at the bottom of the recessed portion 13 and the metal silicide layers 6 sandwiching the recessed portion 13 are exposed At this time, it is preferable to employ wet etching in order to minimize damage to the non impurity doped layer 4 and the metal silicide layers 6.

Figure 8E:
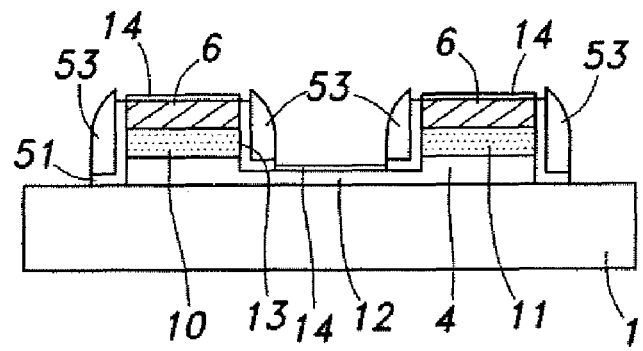

In a step shown in FIG. 8E, the insulating films 14 are formed as selected on top surfaces of the exposed channel formation region 12 and metal silicide layers 6 by thermal oxidation. It is also possible to form an insulating film to cover an entire surface by a CVD method or the like.

Subsequently, in a step shown in FIG. 5F, the gate electrode 15 is formed in the recessed portion 13 over the channel formation region 12 with the insulating film 14 interposed therebetween.

After that, through steps similar to those shown in FIGS. 1I and 1J, the interlayer insulating film 16, the opening portions 17, and the conductive films 18 are formed, so that a TFT 20f is manufactured.

In this TFT 20f, leakage current between the gate electrode 15 and the metal silicide layers 6 can be prevented more reliably because the sidewalls 53 are provided to cover side surfaces of the recessed portion 13. Further, also in this embodiment, it is also possible to dope with impurity ions to form the source region 10 and the drain region 11 after forming the gate electrode 15, in a similar manner to the embodiment shown in FIGS. 4A to 4G.

The semiconductor device (TFT) and the method for manufacturing the semiconductor device of the present invention can be used for manufacturing a pixel transistor of a liquid crystal display device and a TFT for switching a peripheral driver circuit, for example. Further, the semiconductor device (TFT) and the method for manufacturing the semiconductor device of the present invention can also be used for manufacturing a switching TFT in a common semiconductor integrated circuit. Examples of electronic devices to which the present invention can be applied include a desktop display, a floor-stand display, a wall-hung type display, a video camera, a digital camera, a goggle-shaped display, a navigation system, an audio reproducing device (e.g., a car audio or an audio component stereo), a computer, a game machine, a portable information terminal (e.g., a mobile computer, a cellular phone, a portable game machine, or an electronic book), and an image reproducing device provided with a recording medium (e.g., a device with which video or still images recorded in a recording medium such as a digital versatile disc (DVD) is reproduced and which has a display portion for displaying the reproduced image). Specific examples of the electronic devices are illustrated in FIGS. 9A to 9H.

Figure 9A:
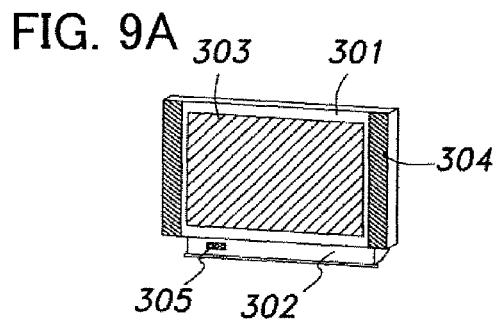
FIG. 9A to 9H are perspective views showing electronic devices to which the present invention can be applied.

FIG. 9A illustrates a desktop display, a floor-stand display, or a wall-hung type display, which includes a housing 301, a supporting base 302, a display portion 303, a speaker portion 304, a video input terminal 305, and the like. Such a display can be used as any display device for displaying information, e.g., for a personal computer, TV broadcast reception, or advertisement display. The semiconductor device and the method for manufacturing the semiconductor device of the present invention can be used for a pixel transistor of the display portion and/or a switching transistor of a peripheral driver circuit of such a display device, whereby resistance of a source region and a drain region of the transistor and contact resistance therewith can be reduced and display devices with less heat generation and less power consumption can be manufactured in a high yield.

Figure 9B:
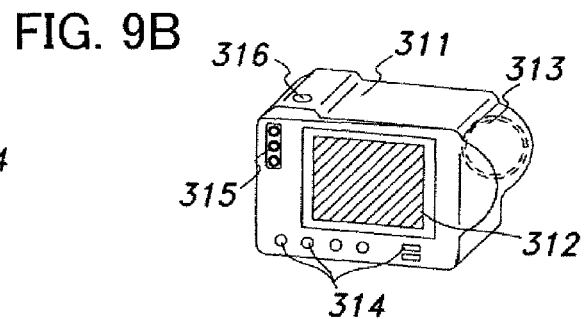

FIG. 9B illustrates a digital camera which includes a main body 311, a display portion 312, an image receiving portion 313, operating keys 314, an external connection port 315, a shutter button 316, and the like. The semiconductor device and the method for manufacturing the semiconductor device of the present invention can be used for a pixel transistor of the display portion and/or a switching transistor of a peripheral driver circuit of such a digital camera, whereby resistance of a source region and a drain region of the transistor and contact resistance therewith can be reduced and digital cameras with less heat generation and less power consumption can be manufactured in a high yield.

Figure 9C:
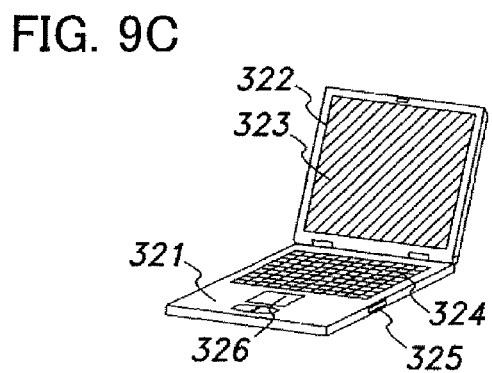

FIG. 9C illustrates a computer which includes a main body 321, a housing 322, a display portion 323, a keyboard 324, an external connection port 325, a pointing device 326, and the like. A computer includes the categories of a mobile computer, typified by a notebook computer, and a stationary computer, typified by a desktop computer. The semiconductor device and the method for manufacturing the semiconductor device of the present invention can be used for a pixel transistor of the display portion and/or a switching transistor of a peripheral driver circuit of such a computer, whereby resistance of a source region and a drain region of the transistor and contact resistance therewith can be reduced and computers with less heat generation and less power consumption can be manufactured in a high yield.

Figure 9D:
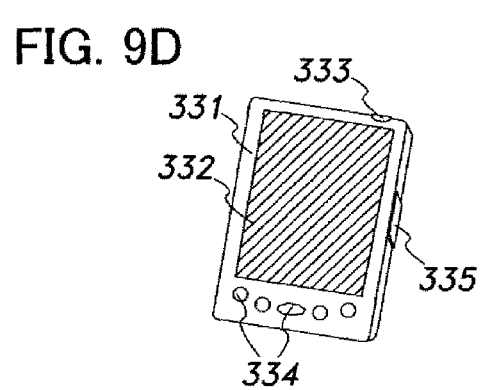

FIG. 9D illustrates a mobile computer which includes a main body 331, a display portion 332, a switch 333, operating keys 334, an infrared port 335, and the like. The semiconductor device and the method for manufacturing the semiconductor device of the present invention can be used for a pixel transistor of the display portion and/or a switching transistor of a peripheral driver circuit of such a mobile computer, whereby resistance of a source region and a drain region of the transistor and contact resistance therewith can be reduced and mobile computers with less heat generation and less power consumption can be manufactured in a high yield.

Figure 9E:
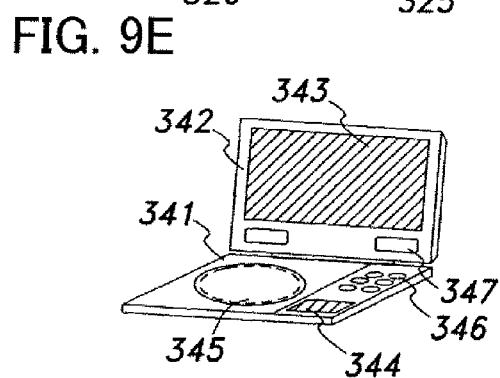

FIG. 9E illustrates a portable image reproducing device provided with a recording medium (specifically, a DVD reproducing device) which includes a main body 341, a housing 342, a first display portion 343, a second display portion 344, a recording medium (DVD or the like) reading portion 345, operating keys 346, a speaker portion 347, and the like. The first display portion 343 mainly displays image data and the second display portion 344 mainly displays text data. An image reproducing device provided with a recording medium further includes the category of a home video game machine and the like. The semiconductor device and the method for manufacturing the semiconductor device of the present invention can be used for pixel transistors of the first and second display portions and/or a switching transistor of a peripheral driver circuit of such a portable image reproducing device, whereby resistance of a source region and a drain region of the transistor and contact resistance therewith can be reduced and portable image reproducing devices with less heat generation and less power consumption can be manufactured in a high yield.

Figure 9F:
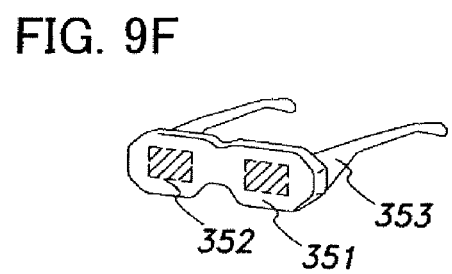

FIG. 9F illustrates a goggle-shaped display which includes a main body 351, a display portion 352, and an arm portion 353. The semiconductor device and the method for manufacturing the semiconductor device of the present invention can be used for a pixel transistor of the display portion and/or a switching transistor of a peripheral driver circuit of such a goggle-shaped display, whereby resistance of a source region and a drain region of the transistor and contact resistance therewith can be reduced and goggle-shaped displays with less heat generation and less power consumption can be manufactured in a high yield.

Figure 9G:
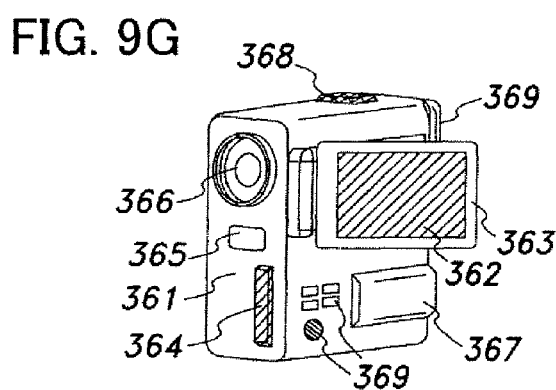

FIG. 9G illustrates a video camera which includes a main body 361, a display portion 362, a housing 363, an external connection port 364, a remote control receiving portion 365, an image receiving portion 366, a battery 367, an audio input portion 368, operation keys 369, and the like. The semiconductor device and the method for manufacturing the semiconductor device of the present invention can be used for a pixel transistor of the display portion and/or a switching transistor of a peripheral driver circuit of such a video camera, whereby resistance of a source region and a drain region of the transistor and contact resistance therewith can be reduced and video cameras with less heat generation and less power consumption can be manufactured in a high yield.

Figure 9H:
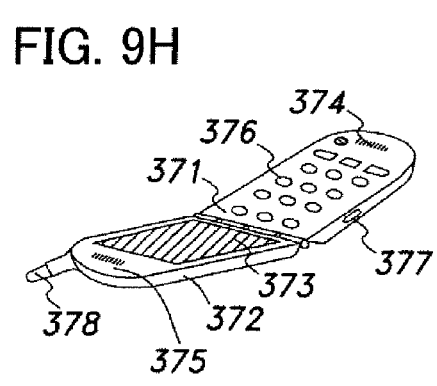

FIG. 9H illustrates a mobile phone which includes a main body 371, a housing 372, a display portion 373, an audio input portion 374, an audio output portion 375, operating keys 376, an external connection port 377, an antenna 378, and the like. The semiconductor device and the method for manufacturing the semiconductor device of the present invention can be used for a pixel transistor of the display portion and/or a switching transistor of a peripheral driver circuit of such a mobile phone, whereby resistance of a source region and a drain region of the transistor and contact resistance therewith can be reduced and mobile phones with less heat generation and less power consumption can be manufactured in a high yield.

The display portions of the above electronic devices may be either of a self-light-emitting type, in which a light-emitting element such as an LED or an organic EL element is used in each pixel, or of a type in which another light source such as a backlight is used as in a liquid crystal display. In a case of a self-light-emitting type, a backlight is not required and a thinner display portion than that of a liquid crystal display can be made.

The above electronic devices have been used more and more for displaying information distributed through a telecommunication line such as the Internet or CATV (cable TV), or for a TV receptor; in particular, for displaying moving image data. A display portion of a self-light-emitting type is suitable for displaying such moving images because a light-emitting material such as an organic EL element exhibits a remarkably high response as compared to liquid crystals. Further, high response speed is preferable also for time division driving. In a case of a self-light-emitting type, further, it can be used for a front-type or rear-type projector by magnifying and projecting light including output image data with a lens or the like.

Since light-emitting parts consume power in a self-light-emitting display portion, information is preferably displayed so that the light-emitting parts may occupy as small area as possible. Accordingly, in a case of adopting a self-light-emitting type for a display portion that mainly displays character data, e.g., in a portable information terminal, in particular, a mobile phone or an audio reproducing device, it is preferable to operate the device in such a manner that light-emitting parts are used for displaying character data with non-light-emitting parts used as a background.

As described above, the application range of the present invention is so wide that it can be applied to electronic devices of all fields.

This application is based on Japanese Patent Application serial No. 2007-269036 filed with Japan Patent Office on Oct. 16, 2007, the entire contents of which are hereby incorporated by reference.

What is claimed is:

1. A method for manufacturing a semiconductor device comprising the steps of:
 forming a semiconductor film over an insulator, using a semiconductor material including silicon;
 forming a metal silicide layer on an upper surface of the semiconductor film;
 patterning the metal silicide layer and the semiconductor film by etching, thereby forming a recessed portion at a position corresponding to a channel formation region of the semiconductor device, and thinning a portion of the semiconductor film which is located at a bottom of the recessed portion to a desired thickness;
 forming an insulating film to cover at least the patterned metal silicide layer and the thinned portion of the semiconductor film; and
 forming a gate electrode over the thinned portion of the semiconductor film with the insulating film interposed therebetween.

2. A method for manufacturing a semiconductor device comprising the steps of:
 forming a semiconductor film over an insulator, using a semiconductor material including silicon;
 doping the semiconductor film with an impurity element to a depth less than a thickness of the semiconductor film, thereby forming an impurity doped layer and a non impurity doped layer under the impurity doped layer;
 forming a metal silicide layer on an upper surface of the semiconductor film;
 patterning the metal silicide layer and the semiconductor film by etching, thereby forming a recessed portion which reaches the non impurity doped layer at a position corresponding to a channel formation region of the semiconductor device, and thinning a portion of the semiconductor film which is located at a bottom of the recessed portion to a desired thickness;
 forming an insulating film to cover at least the patterned metal silicide layer and the thinned portion of the semiconductor film; and
 forming a gate electrode over the thinned portion of the semiconductor film with the insulating film interposed therebetween.

3. A method for manufacturing a semiconductor device comprising the steps of:
 forming a semiconductor film over an insulator, using a semiconductor material including silicon;
 doping the semiconductor film with an impurity element to a depth less than a thickness of the semiconductor film, thereby forming an impurity doped layer and a non impurity doped layer under the impurity doped layer;
 forming a metal silicide layer on an upper surface of the semiconductor film;
 patterning the metal silicide layer and the semiconductor film by etching, thereby forming a recessed portion which reaches the non impurity doped layer at a position corresponding to a channel formation region of the semiconductor device, and thinning a portion of the semiconductor film which is located at a bottom of the recessed portion to a desired thickness;
 forming an insulating film to cover at least the thinned portion of the semiconductor film; and
 forming a gate electrode over the thinned portion of the semiconductor film with the insulating film interposed therebetween,
 wherein the step of patterning the metal silicide layer and the semiconductor film by etching comprises the steps of:
 exposing a portion of the semiconductor film by isotropically etching the metal silicide layer using a resist as a mask, which has an opening that is the same length as a length of the gate electrode in a channel length direction; and
 etching the exposed portion of the semiconductor film anisotropically using the resist having the opening as a mask.

4. A method for manufacturing a semiconductor device comprising the steps of:
 forming a semiconductor film over an insulator, using a semiconductor material including silicon;
 doping the semiconductor film with an impurity element to a depth less than a thickness of the semiconductor film, thereby forming an impurity doped layer and a non impurity doped layer under the impurity doped layer;
 forming a metal silicide layer on an upper surface of the semiconductor film;
 patterning the metal silicide layer and the semiconductor film by etching, thereby forming a recessed portion which reaches the non impurity doped layer at a position corresponding to a channel formation region of the semiconductor device, and thinning a portion of the semiconductor film which is located at a bottom of the recessed portion to a desired thickness;
 forming an insulating film to cover at least the thinned portion of the semiconductor film; and
 forming a gate electrode over the thinned portion of the semiconductor film with the insulating film interposed therebetween,
 wherein the step of patterning the metal silicide layer and the semiconductor film by etching comprises the steps of:
 forming a resist to cover the metal silicide layer;
 exposing the resist to light and developing the resist using a half-tone mask, thereby forming a patterned resist which has an opening at a position corresponding to the channel formation region of the semiconductor device, a portion with a relatively small thickness at a portion adjacent to the opening, and a portion with a relatively large thickness at an outer side of and adjacent to the portion with a relatively small thickness; and
 etching the metal silicide layer and the semiconductor film using the patterned resist.

5. A method for manufacturing a semiconductor device comprising the steps of:
 forming a semiconductor film over an insulator, using a semiconductor material including silicon;
 doping the semiconductor film with an impurity element to a depth less than a thickness of the semiconductor film, thereby forming an impurity doped layer and a non impurity doped layer under the impurity doped layer;
 forming a metal silicide layer on an upper surface of the semiconductor film;
 patterning the metal silicide layer and the semiconductor film by etching, thereby forming a recessed portion which reaches the non impurity doped layer at a position corresponding to a channel formation region of the semiconductor device, and thinning a portion of the semiconductor film which is located at a bottom of the recessed portion to a desired thickness;

forming an insulating film to cover at least the thinned portion of the semiconductor film:

forming a gate electrode over the thinned portion of the semiconductor film with the insulating film interposed therebetween, forming a sidewall film to cover a surface of the patterned metal silicide layer and the patterned semiconductor film, and etching the sidewall film, whereby a portion of the sidewall film which is along a side surface of the recessed portion remains as a sidewall and the thinned portion of the semiconductor film is exposed;

wherein the steps of forming the sidewall film and etching the sidewall film are carried out after the step of patterning the metal silicide layer and the semiconductor film by etching, and the step of forming the insulating film to cover the thinned portion of the semiconductor film is carried out after the step of etching the sidewall film.

6. The method for manufacturing a semiconductor device according to claim 5, wherein the step of forming the sidewall film comprises the steps of:

forming a first sidewall film comprising one of a first material and a second material wherein the first material is silicon oxynitride and the second material is one of silicon nitride and silicon nitride oxide, and forming a second sidewall film over the first sidewall film, the second side wall film comprising the other of the first material and the second material;

wherein the step of etching the sidewall film comprises the steps of:

etching the second sidewall film so that a portion of the second sidewall film which is along the side surface of the recessed portion can remain, to make the remaining portion of the second sidewall film a sidewall, and removing a portion of the first sidewall film which is not covered with the second sidewall film by etching, thereby exposing the thinned portion of the semiconductor film.

7. A method for manufacturing a semiconductor device comprising the steps of:

forming a semiconductor film over an insulator, using a semiconductor material including silicon;

forming a metal silicide layer on an upper surface of the semiconductor film;

patterning the metal silicide layer and the semiconductor film by etching, thereby forming a recessed portion at a position corresponding to a channel formation region of the semiconductor device, and thinning a portion of the semiconductor film which is located at a bottom of the recessed portion to a desired thickness;

forming an insulating film to cover at least the thinned portion of the semiconductor film;

forming a gate electrode over the thinned portion of the semiconductor film with the insulating film interposed therebetween; and doping a portion of the semiconductor film which is located under the metal silicide layer with an impurity element through the metal silicide layer using the gate electrode as a mask.

8. The method for manufacturing a semiconductor device according to claim 7, wherein the step of patterning the metal silicide layer and the semiconductor film by etching comprises the steps of:

exposing a portion of the semiconductor film by isotropically etching the metal silicide layer using a resist as a mask, which has an opening that is the same length as a length of the gate electrode in a channel length direction; and etching the exposed portion of the semiconductor film anisotropically using the resist having the opening as a mask.

9. The method for manufacturing a semiconductor device according to claim 7, wherein the step of patterning the metal silicide layer and the semiconductor film by etching comprises the steps of:

forming a resist to cover the metal silicide layer;

exposing the resist to light and developing the resist using a half-tone mask, thereby forming a patterned resist which has an opening at a position corresponding to the channel formation region of the semiconductor device, a portion with a relatively small thickness at a portion adjacent to the opening, and a portion with a relatively large thickness at an outer side of and adjacent to the portion with a relatively small thickness; and etching the metal silicide layer and the semiconductor film using the patterned resist.

10. The method for manufacturing a semiconductor device according to claim 7, further comprising the steps of:

forming a sidewall film to cover a surface of the patterned metal silicide layer and the patterned semiconductor film, and etching the sidewall film, whereby a portion of the sidewall film which is along a side surface of the recessed portion remains as a sidewall and the thinned portion of the semiconductor film is exposed;

wherein the steps of forming the sidewall film and etching the sidewall film are carried out after the step of patterning the metal silicide layer and the semiconductor film by etching, and the step of forming the insulating film to cover the thinned portion of the semiconductor film is carried out after the step of etching the sidewall film.

11. The method for manufacturing a semiconductor device according to claim 10, wherein the step of forming the sidewall film comprises the steps of:

forming a first sidewall film comprising one of a first material and a second material wherein the first material is silicon oxynitride and the second material is one of silicon nitride and silicon nitride oxide, and forming a second sidewall film over the first sidewall film, the second side wall film comprising the other of the first material and the second material;

wherein the step of etching the sidewall film comprises the steps of:

etching the second sidewall film so that a portion of the second sidewall film which is along the side surface of the recessed portion can remain, to make the remaining portion of the second sidewall film a sidewall, and removing a portion of the first sidewall film which is not covered with the second sidewall film by etching, thereby exposing the thinned portion of the semiconductor film.

12. A method for manufacturing a semiconductor device comprising the steps of:

forming a semiconductor film over an insulator, using a semiconductor material including silicon;

forming a metal silicide layer on an upper surface of the semiconductor film;

patterning the metal silicide layer and the semiconductor film by etching, thereby forming a recessed portion at a position corresponding to a channel formation region of the semiconductor device, and thinning a portion of the semiconductor film which is located at a bottom of the recessed portion to a desired thickness;

forming an insulating film to cover at least the thinned portion of the semiconductor film; and forming a gate electrode over the thinned portion of the semiconductor film with the insulating film interposed therebetween, wherein the step of patterning the metal silicide layer and the semiconductor film by etching comprises the steps of:

exposing a portion of the semiconductor film by isotropically etching the metal silicide layer using a resist as a mask, which has an opening that is the same length as a length of the gate electrode in a channel length direction; and etching the exposed portion of the semiconductor film anisotropically using the resist having the opening as a mask.

13. A method for manufacturing a semiconductor device comprising the steps of:

forming a semiconductor film over an insulator, using a semiconductor material including silicon;

forming a metal silicide layer on an upper surface of the semiconductor film;

patterning the metal silicide layer and the semiconductor film by etching, thereby forming a recessed portion at a position corresponding to a channel formation region of the semiconductor device, and thinning a portion of the semiconductor film which is located at a bottom of the recessed portion to a desired thickness;

forming an insulating film to cover at least the thinned portion of the semiconductor film; and forming a gate electrode over the thinned portion of the semiconductor film with the insulating film interposed therebetween, wherein the step of patterning the metal silicide layer and the semiconductor film by etching comprises the steps of:

forming a resist to cover the metal silicide layer;

exposing the resist to light and developing the resist using a half-tone mask, thereby forming a patterned resist which has an opening at a position corresponding to the channel formation region of the semiconductor device, a portion with a relatively small thickness at a portion adjacent to the opening, and a portion with a relatively large thickness at an outer side of and adjacent to the portion with a relatively small thickness; and etching the metal silicide layer and the semiconductor film using the patterned resist.

14. A method for manufacturing a semiconductor device comprising the steps of:

forming a semiconductor film over an insulator, using a semiconductor material including silicon;

forming a metal silicide layer on an upper surface of the semiconductor film;

patterning the metal silicide layer and the semiconductor film by etching, thereby forming a recessed portion at a position corresponding to a channel formation region of the semiconductor device, and thinning a portion of the semiconductor film which is located at a bottom of the recessed portion to a desired thickness;

forming an insulating film to cover at least the thinned portion of the semiconductor film;

forming a gate electrode over the thinned portion of the semiconductor film with the insulating film interposed therebetween, forming a sidewall film to cover a surface of the patterned metal silicide layer and the patterned semiconductor film, and etching the sidewall film, whereby a portion of the sidewall film which is along a side surface of the recessed portion remains as a sidewall and the thinned portion of the semiconductor film is exposed;

wherein the steps of forming the sidewall film and etching the sidewall film are carried out after the step of patterning the metal silicide layer and the semiconductor film by etching, and the step of forming the insulating film to cover the thinned portion of the semiconductor film is carried out after the step of etching the sidewall film.

15. The method for manufacturing a semiconductor device according to claim 14, wherein the step of forming the sidewall film comprises the steps of:

forming a first sidewall film comprising one of a first material and a second material wherein the first material is silicon oxynitride and the second material is one of silicon nitride and silicon nitride oxide, and forming a second sidewall film over the first sidewall film, the second sidewall film comprising the other of the first material and the second material;

wherein the step of etching the sidewall film comprises the steps of:

etching the second sidewall film so that a portion of the second sidewall film which is along the side surface of the recessed portion can remain, to make the remaining portion of the second sidewall film a sidewall, and removing a portion of the first sidewall film which is not covered with the second sidewall film by etching, thereby exposing the thinned portion of the semiconductor film.

* * * * *

UNITED STATES PATENT AND TRADEMARK OFFICE
CERTIFICATE OF CORRECTION

PATENT NO.        : 8,053,289 B2
APPLICATION NO.   : 12/251596
DATED             : November 8, 2011
INVENTOR(S)       : Takashi Shingu et al.

It is certified that error appears in the above-identified patent and that said Letters Patent is hereby corrected as shown below:

Column 7, line 15, "metal suicide layer" should read "metal silicide layer"

Column 10, line 65, "as shown in FIG. 11" should read "as shown in FIG. 1I"

Column 12, lines 9-10, "the recessed portion 13 (see FIG. 23)" should read
           "the recessed portion 13 (see FIG. 2B)"

Column 12, line 44, "the conductive film IS" should read "the conductive film 18"

Column 13, line 63, "Further; a light-blocking film 33" should be
           "Further, a light-blocking film 33"

Column 14, lines 52-53, "FIG. 5F is manufactured," should be "FIG. 5F is manufactured."

Column 15, line 22, "shown in FIG. 10G" should read "shown in FIG. 1G"

Column 15, line 27, "a TUT 20e as shown in FIG. 7D" should read
           "a TFT 20e as shown in FIG. 7D"

Column 15, line 36, "shown in FIG; 7D" should be "shown in FIG. 7D"

Figure 8F:
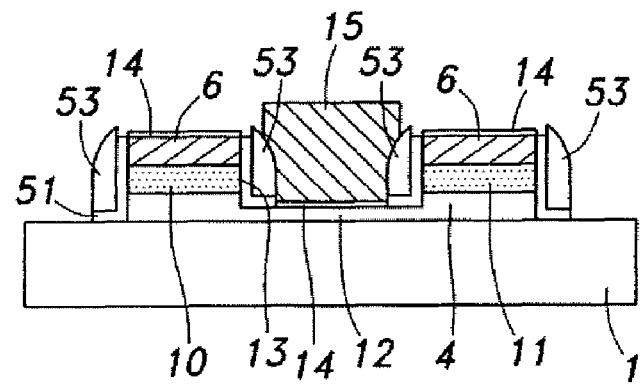
Figure 8G:
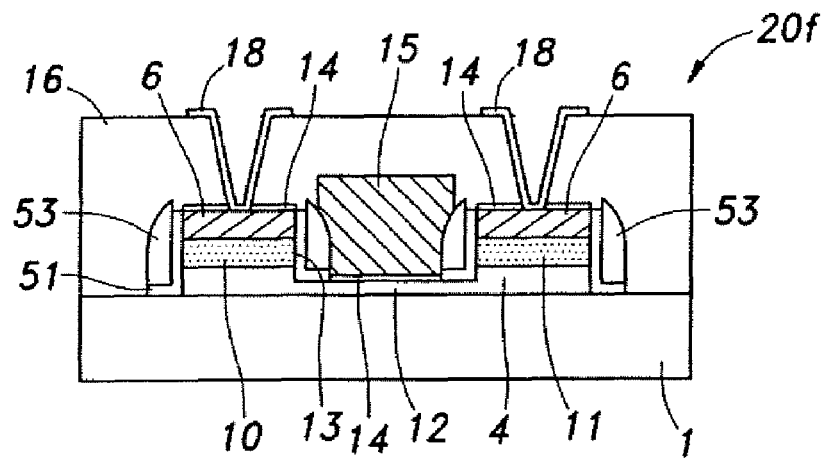

Column 16, line 23, "in a step shown in FIG. 5F" should read "in a step shown in FIG. 8F"

In the Claims:

Column 21, claim 5, line 4, "portion of the semiconductor film:" should be
           "portion of the semiconductor film;"

Signed and Sealed this
Twenty-first Day of February, 2012

David J. Kappos
*Director of the United States Patent and Trademark Office*

CERTIFICATE OF CORRECTION (continued)
U.S. Pat. No. 8,053,289 B2

Column 21, claim 5, lines 6-7, "the insulating film interposed therebetween," should be "the insulating film interposed therebetween;"

Column 21, claim 5, lines 9-10, "the patterned semiconductor film, and" should be "the patterned semiconductor film; and"

Column 21, claim 5, line 14, "semiconductor film is exposed;" should be "semiconductor film is exposed,"